United States Patent [19]

Chiappetta

[11] Patent Number: 4,791,380

[45] Date of Patent: Dec. 13, 1988

[54] DETECTOR CIRCUIT WITH DUAL-DIODE COMPENSATION

[75] Inventor: Joseph F. Chiappetta, Trumbull, Conn.

[73] Assignee: Microphase Corporation, Norwalk, Conn.

[21] Appl. No.: 107,644

[22] Filed: Oct. 9, 1987

[51] Int. Cl.$^4$ .................... H03D 1/06; H03K 3/06
[52] U.S. Cl. .................... 329/179; 329/204; 329/205 R; 307/491; 307/310; 307/317 A
[58] Field of Search ............... 307/491, 317 R, 317 A, 307/494, 310, 503, 529; 329/204, 202, 178, 179, 205 R, 206; 455/337

[56] References Cited

U.S. PATENT DOCUMENTS

| | | | |
|---|---|---|---|
| 3,288,656 | 11/1966 | Nakamura | 307/303 |
| 3,842,359 | 10/1974 | Dickens | 330/4.9 |
| 4,000,472 | 12/1976 | Eastland | 329/204 |
| 4,228,371 | 10/1980 | Mazgy | 307/317 A |
| 4,249,134 | 2/1981 | Stacey | 329/205 R |
| 4,400,630 | 10/1983 | Owen | 307/317 |
| 4,490,681 | 12/1984 | Turner | 329/204 |

OTHER PUBLICATIONS

"Schottky Diode Pair Makes an RF Detector Stable" by Turner, R. J., Electronics (May 2, 1974), pp. 94-95.

Primary Examiner—Stanley D. Miller
Assistant Examiner—Nancy Thai
Attorney, Agent, or Firm—Perman & Green

[57] ABSTRACT

A detector circuit for radio-frequency signals is formed of a pair of matched diodes disposed on a common substrate which is heated by a temperature responsive feedback circuit to stabilize the temperature of the substrate and the diodes. A capacitor is connected to one or both of the diodes to form a detector of the detector circuit. A bias circuit provides equal bias currents to the two diodes, and an amplifier is connected to the two diodes to extract voltages associated with the bias currents, and to subtract these voltages in a differential manner so as to exclude the effect of bias voltage from an output signal of the amplifier. The amplifier is also coupled to an output terminal of the detector to isolate the detector from subsequent stages of signal processing, as well as to amplify detected signals. The diodes are each, preferably, Schottky diodes for improved dynamic range of signal detection.

17 Claims, 3 Drawing Sheets

DETECTOR CIRCUIT WITH DUAL-DIODE COMPENSATION

BACKGROUND OF THE INVENTION

This invention relates to a detector circuit employing Schottky diodes for detection of radio-frequency (r.f.) signals and other time-varying signals and, more particularly, to a detection circuit employing a matched pair of Schottky diodes disposed on a thermally stabilized substrate and coupled via a dual channel amplifier for rejection of a common mode of bias voltage drift in an output detected signal for freeing the detected signal from the effects of thermally induced drift in diode parameters.

Detector circuits are employed for detecting signals having time-varying waveforms. Of particular interest herein, are detectors of r.f. signals which may be received from a distant site via an antenna, or from other electronic equipment, and coupled to a detector circuit. With respect to the detection of an r.f. signal, it is noted that the detection of both modulated and unmodulated r.f. signals is of interest. The detection of an unmodulated r.f. signal, or a modulated r.f. signal wherein the amplitude varies slowly, is of particular interest in the construction of detector circuits because the presence of thermal drift in bias voltages or other circuit parameters may well mask or distort the detection of such r.f. signals, particularly relatively weak r.f. signals wherein the amplitude is commensurate with signal disturbances induced by drift.

It has been the practice to employ tunnel diodes in the construction of detectors because the tunnel diode has the important characteristic of operating with zero bias current and zero offset output voltage, while still maintaining good signal sensitivity. The zero offset voltage enables a tunnel diode detector to be employed with high accuracy in use with direct coupled (DC) amplifiers. It is further noted that the use of the tunnel diode as a detector with a DC amplifier avoids any significant output voltage drift with temperature, thereby avoiding errors associated with such drift.

The use of the tunnel diode, however, incurs performance disadvantages with respect to dynamic range. For example, the useful input power dynamic range is relatively small, typically a range of 40 decibels (dB). Also, the maximum power input level should be kept below, typically +15 dBm (relative to a milliwatt). Also, the recovery to high level, wide pulse signals, is poor. Available construction techniques with tunnel diodes does not lend itself to high reliability and, furthermore, the operating temperature range is limited to 100 degrees centigrade in the use of germanium as a construction material. These disadvantages may well outweigh the major benefit of temperature stability.

The foregoing disadvantages are avoided in the use of a Schottky r.f. detector diode. Such a diode has a wider useful dynamic range of typically +15 dBm to −44 dBm. Input power may be greater such as +20 dBm, without damage to the Schottky diode. Also, such diode has good recovery characteristics. Another advantage of the Schottky diode over the tunnel diode is the higher operating temperature range of +125 degrees C. The construction is more rugged and more reliable than that of the tunnel diode.

A major problem arises in the use of the Schottky diode for detection purposes due to the fact that the diode must be operated with a bias current in order to increase the sensitivity to a useful level. The bias current introduces an offset voltage which has a temperature drift coefficient of approximately 1 millivolt per degree Centigrade. The temperature induced voltage drift can generate an offset voltage which is large enough to severely mask the signal which is to be detected.

SUMMARY OF THE INVENTION

The foregoing problem is overcome and other advantages are provided by a detector circuit which, in accordance with the invention, employs a pair of matched Schottky diodes, preferably formed in a monolithic assembly to ensure substantially identical characteristics. The two diodes are each provided individually with bias current, and are connected in differential fashion to two input channels of an amplifier which acts to amplify a detected signal while rejecting a common mode of signal voltage associated with bias current. In the monolithic construction, both of the diodes are disposed on a common substrate which maintains equality of temperature between the two diodes. Therefore, any change in bias voltage due to thermally induced drift is the same in both of the diodes. By subtraction of the common mode by operation of the differential amplifier circuit, thermally induced drift is essentially absent from a signal outputted by the amplifier. An input r.f. signal is applied to one of the diodes for detection, and a signal outputted via either one or both of the diodes in response to a detected r.f. signal is amplified by the two branches of the amplifier.

In accordance with a further feature of the invention, one of the two diodes, or a third diode is employed as a sensor of temperature, changes in bias current through the sensing diode being employed as an input signal to a further amplifier which drives a heater to maintain the foregoing substrate at a constant temperature. The substrate with the diodes thereon may be placed within an oven maintained at a constant temperature by means of the foregoing heater. The maintenance of the constant temperature further reduces any tendency of detected signal to drift due to thermally induced variation in bias voltage.

In accordance with yet another feature of the invention, an embodiment of the invention is provided in which one input channel of the amplifier has a higher gain than the other input channel, the lower gain channel being coupled to the cathode terminals of both of the diodes to effect the common mode rejection, while the higher gain channel connects with only one of the diodes, namely, the diode which is not connected to the input r.f. signal. There results a cross coupling of a detected r.f. signal between the two diodes such that, only relatively small signals can be amplified by the high gain channel. The small signals are limited by a bias network so that the larger signals are amplified by the low gain channel. This arrangement of circuitry produces an increased dynamic range in signal amplitude, while still attaining the common mode rejection for high accuracy in the detection of relatively small amplitude signals.

BRIEF DESCRIPTION OF THE DRAWING

The aforegoing aspects and other features of the invention are explained in the following description, taken in connection with the accompanying drawing wherein.

DETAILED DESCRIPTION

Figure 1:
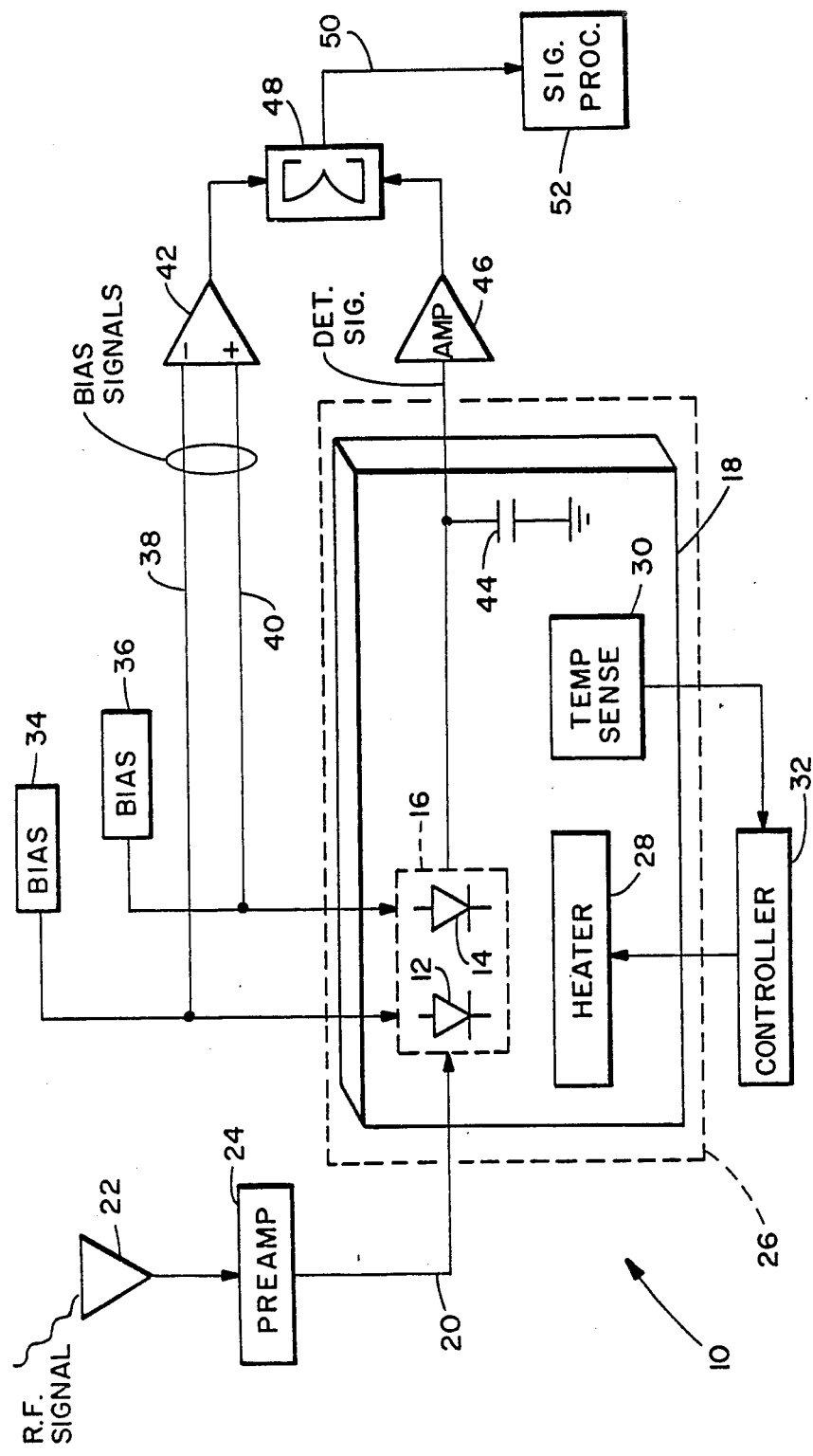
FIG. 1 is a simplified diagrammatic view of basic components of the detector circuit of the invention.

FIG. 1 shows a diagrammatic view of a detector circuit of the invention. The diagram of FIG. 1 is greatly simplified to show only the major features of the invention, with details of the specific embodiments to be described subsequently with reference to FIGS. 2 and 3.

In FIG. 1, a first diode 12 and a second diode 14 are formed monolithically within an assembly 16 disposed on a common substrate 18. The two diodes 12 and 14 are constructed as a matched pair wherein the electrical and thermal characteristics of the two diodes are matched. Both of the diodes 12 and 14, in a preferred embodiment of the invention, are Schottky diodes which allow for increased dynamic range of an input signal on line 20. By way of example, the input signal may be an r.f. signal composed of an amplitude modulated carrier. The signal is shown being received at an antenna 22 and amplified by a preamplifier 24 before being coupled via the line 20 to the diode assembly 16. As a further example, (not shown) the input signal may be provided by other electrical equipment.

In accordance with a feature of the invention, the substrate 18 is disposed within an oven 26 having an internal temperature which is maintained higher than that of the environment. The substrate 18 is raised to a still higher temperature than the internal temperature of the oven 26 by a heater 28 disposed directly on the substrate 18 and in thermal contact therewith. A temperature sensor 30 is also disposed directly on the substrate 18 and in thermal contact therewith to accurately sense temperature of the substrate 18 and of the diode assembly 16. A controller 32 is responsive to a signal outputted by the sensor 30 for applying electric power to the heater 28 in an amount necessary to maintain a stable predetermined temperature of the substrate 18. In this way, operation of the heater 28 is isolated from variations in temperature of the environment outside the oven 26.

As is well known, Schottky diodes are normally operated with a bias current which introduces a bias offset voltage, which voltage varies with temperature in a manner which may mask a small value of input signal. In order to reduce the effect of variations in the temperature-sensitive bias voltages, a first bias circuit 34 is provided for supplying bias current to the diode 12, and a second bias circuit 36 is provided for supplying bias current to the diode 14. Output bias voltages are extracted from the diodes 12 and 14 by lines 38 and 40 respectively, and are applied to the positive and negative input terminals of a differential amplifier 42. In accordance with the embodiments of the invention to be disclosed in FIGS. 2 and 3, there is provided a storage unit of electrical energy, more specifically a capacitor 44, which is connected to one or more of the diodes of the assembly 16 to enable the diodes to act as a detector of the input signal on line 20. The detected signal appears across the terminals of the capacitor 44, and is applied to an amplifier 46. Output signals of the amplifiers 42 and 46 are summed together by a summer 48 and applied via a line 50 to some form of utilization device, for example, a signal processor 52. By way of further example, the signal processor 52 may include a logarithmic amplifier, storage elements, and integration elements (not shown) as are commonly used in signal processing. The two amplifiers 42 and 46 serve to isolate the process of detection by the diodes 12 and 14 from the subsequent circuitry of the processor 52, and also amplify the signals to a level suitable for operation of the circuits of the processor 52.

In particular, it is noted that the differential action of the amplifier 42 substracts out the common mode of offset voltages introduced by the bias currents in the diodes 12 and 14. Thereby, the signal outputted by the summer 48 on line 50 is essentially free of thermal variations in bias offset voltage, both because of the accurate temperature regulation of the substrate 18, as well as because of the extraction of the common mode of bias signal voltages by the amplifier 42.

Figure 2:
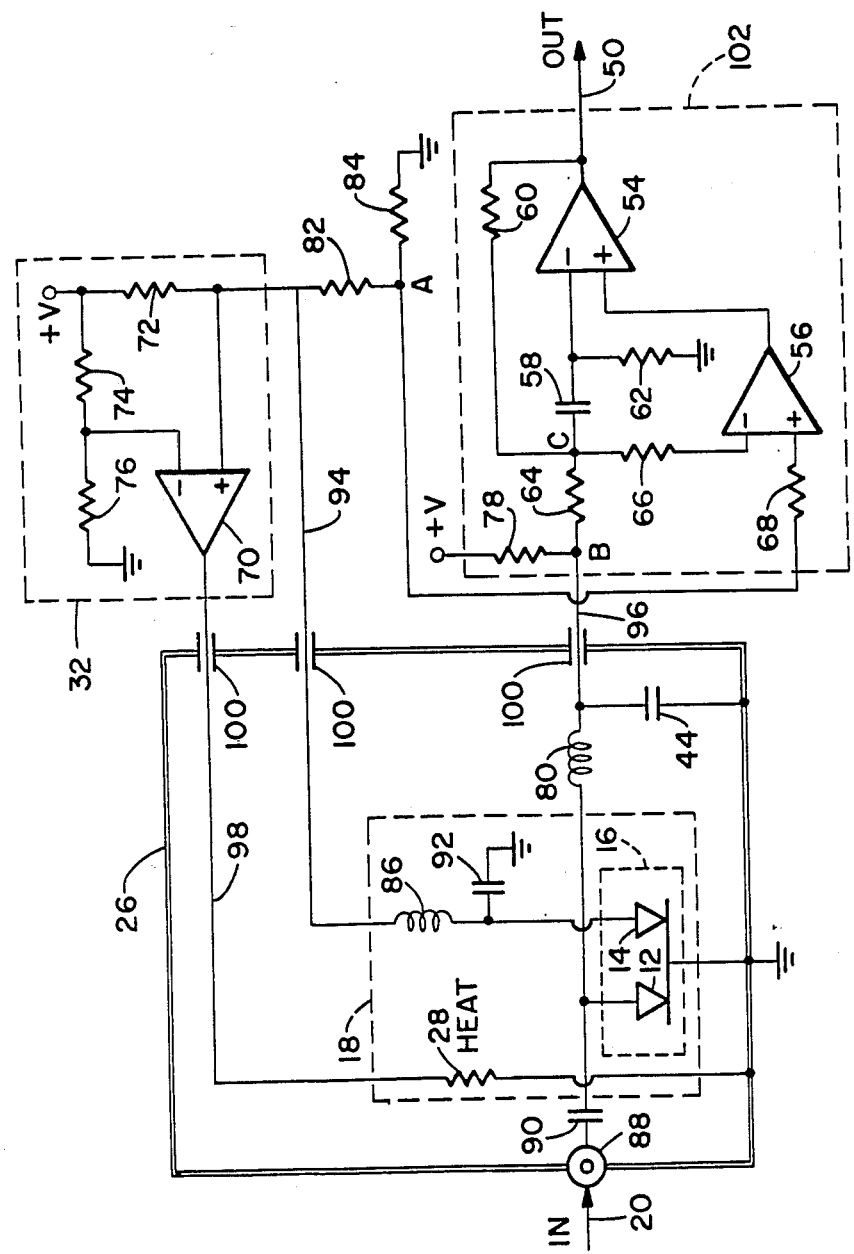
FIG. 2 is a schematic diagram of a first embodiment of the invention in which one of a matched pair of diodes is used for signal detection, and the other diode of the pair of diodes is used as a sensor of temperature.

There are two basic arrangements of the diodes 12 and 14 in the detector circuit 10. The detector circuit 10 can be constructed by either a serial connection of diode and capacitor or by a parallel connection of diode and capacitor. The parallel connection and the serial connection will be disclosed respectively in FIGS. 2 and 3. With reference to FIG. 2, there is shown a first embodiment of the invention comprising the assembly 16 of diodes 12 and 14 supported on the substrate 18 within the oven 26 as was disclosed in FIG. 1. Also shown in FIG. 2 is the controller 32 and the capacitor 44 of FIG. 1. The function of the heater 28 is provided by a resistor, and the function of the temperature sensor 30 is provided by the diode 14 in the embodiment of FIG. 2. The functions of the amplifiers 42 and 46 and the summer 48 (FIG. 1) are accomplished in the embodiment of FIG. 2 by two operational amplifiers 54 and 56 and a capacitor 58 which are interconnected by a set of resistors 60, 62, 64, 66 and 68.

The controller 32 comprises an amplifier 70 and resistors 72, 74, and 76. The function of the bias circuits 34 (FIG. 1) is accomplished in FIG. 2 by a resistor 78 coupled via an inductor 80 to the anode of the diode 12, the cathode of the diode 12 being grounded. The oven 26 is presumed to be constructed of metal, or to include a metal screen (not shown) which serves as a radio-frequency shield which also is grounded. The function of the bias circuit 36 (FIG. 1) is accomplished in FIG. 2 by a voltage divider comprising the resistor 72 and resistors 82 and 84 which are connected in series. The junction between the resistors 72 and 82 is connected to a positive input terminal of the amplifier 70, and is also connected via an inductor 86 to the anode of the diode 14, the cathode of the diode 14 being grounded. The inductor 86 conducts bias current from the divider circuit of resistor 72, 82, and 84 to the diode 14. An r.f. signal, input on line 20, is coupled via an r.f. connector 88 to circuitry within the oven 26. The signal at the connector 88 is coupled by a capacitor 90 to the junction of the inductor 80 and the diode 12. A capacitor 92 connects between ground and the junction of the inductor 86 with the diode 14. The combination of the inductor 86 and the capacitor 92 serves as a filter for removal of any r.f. signals which may be present on a line 94 connecting the inductor 86 with the resistor 82. The inductor 80 together with the capacitor 44 serve as a filter for removal of any r.f. signals which may be present on line 96, by which line a detected signal appearing across the capacitor 44 is outputted to the amplifiers 54 and 56. The heater 28 is connected via a line 98 to an output terminal of the amplifier 70. The three lines 94, 96, and 98 exit a wall of the oven 26 via feed-through terminals 100 which may also include capacitance for capacitively grounding r.f. signals which may be present in the lines 94, 96, and 98 to the wall of the oven 26.

In operation, an input r.f. signal on line 20 is coupled via the capacitor 90 to a detector comprising the diode 12, the inductor 80, and the capacitor 44. Signals outputted by the detector on line 96 are coupled by the series connection of resistor 64 and the capacitor 58 to the negative input terminal of the amplifier 54. The signal on line 96 is also applied by the series connection of resistor 64 and 66 to the negative input terminal of amplifier 56. The junction of capacitor 58 with the amplifier 54 is grounded by the resistor 62. Resistor 60 provides for a feedback path between the output terminal of amplifier 54 on line 50 and the junction of resistor 64 and 66 with capacitor 58. The output terminal of amplifier 56 connects to the positive input terminal of amplifier 54. The positive input terminal of amplifier 56 is connected by resistor 68 to the junction of resistors 82 and 84 in the resistive voltage divider comprising the resistors 72, 82, and 84, the resistors of the divider being connected between a source of voltage (+V) and ground. The serial interconnection of the two amplifiers 54 and 56 with the capacitive feed forward branch across the amplifier 56 and the feedback branch of the resistor 60 encompassing both amplifiers 54 and 56 is a well known amplifier configuration, the feed-forward branch of the capacitor 58 enlarging the bandwidth of the amplifier without unduly increasing any drift in the amplification of DC signals. It is noted that the resistive connections between lines 96 and 50 via the resistors 64, 66 and 60 provide for DC coupling and amplification of signals between the lines 96 and 50.

In accordance with the invention, the assembly 16 of the matched pair of diodes 12 and 14 is mounted on a substrate 18 heated by the heater 28, the temperature of the substrate 18 and of the assembly 16 being sensed by the diode 14. A rise in temperature of the assembly 16 increases the electrical conductivity of the diode 14 to draw more current from the resistive divider, thereby increasing the voltage drop across the resistor 72 and lowering the voltage at the positive input terminal of amplifier 70. The junction of the resistor 72 and 82 of the divider is connected to the positive input terminal of the amplifier 70 of the controller 32. The resistors 74 and 76 are serially connected between the source of voltage V and ground, with the junction of the resistors 74 and 76 being connected to the negative input terminal of the amplifier 70. The negative input terminal of the amplifier 70 is held at a reference voltage set by the serial connection of resistors 74 and 76. Therefore, an increase in conductivity of the diode 14 results in a decrease of voltage on line 98 applied to the heater 28 to reduce the temperature of the substrate 18 and the assembly 16. In the event that the temperature of the assembly 16 drops, the electrical conductivity of the diode 14 decreases resulting in an increase of voltage on line 98 by the controller 32 to increase the amount of heat outputted by the heater 28. In this way, the diode 14 and the heater 28 cooperate in a feedback loop including the controller 32 to maintain the substrate 18 and the assembly 16 at a constant temperature. The resistors 74 and 76 are selected with a ratio of resistance values which establish a desired reference voltage to the positive input terminal of the amplifier 70 for operating the substrate 18 at a desired temperature. If desired, the resistor 74 may be a variable resistor to allow for adjustment of the reference voltage and, hence, the operating temperature of the substrate 18.

In accordance with a further feature of the invention, both of the diodes 12 and 14 are connected to the amplifier configuration of the amplifiers 54 and 56 in a manner which cancels a common mode of DC drift of bias voltages within the two diodes 12 and 14. The junction of the resistors 82 and 84 has been designated as node A, and the junction of resistors 78 and 64 has been designated as node B in FIG. 2 to identify two input terminals of the amplifier configuration of the amplifiers 54 and 56. A thermal drift in the characteristics of the diode 14 introduces a drift signal voltage at node A. A thermal drift in the characteristics of the diode 12 introduces a drift voltage at node B. It is noted that node A connects via resistor 68 to the positive input terminal of amplifier 56 while node B connects via the resistors 64 and 66 to the negative input terminal of amplifier 56. In view of the matched characteristics of the two diodes 12 and 14, a variation in bias voltage drift in the diode 12 due to temperature variations of the substrate 18 closely matches such thermally induced bias voltage drift in the diode 14. Therefore, drift voltages at nodes A and B follow each other and, as a result of the differential connection of these nodes to the amplifier 56, the thermally induced voltage drifts cancel, so as not to appear in the output signal on line 50. As a result, a DC voltage outputted by the detector on line 96, and amplified to appear on line 50, can follow slow variations in amplitude of the r.f. signal (line 20) without distortion of the detected waveform caused by drifting bias voltages of the diodes 12 and 14. This feature of the invention allows the diodes 12 and 14 to be constructed as Schottky diodes for increased dynamic range without the introduction of signal distortion of drifting bias voltages employed in the operation of Schottky diodes. Therefore, the invention, as portrayed in FIG. 2, has reduced the effect of thermally induced bias drift by accurate maintenance of the temperature of the diode assembly 16 while differentially extracting a common mode of bias voltage drift.

Figures 3, 4:
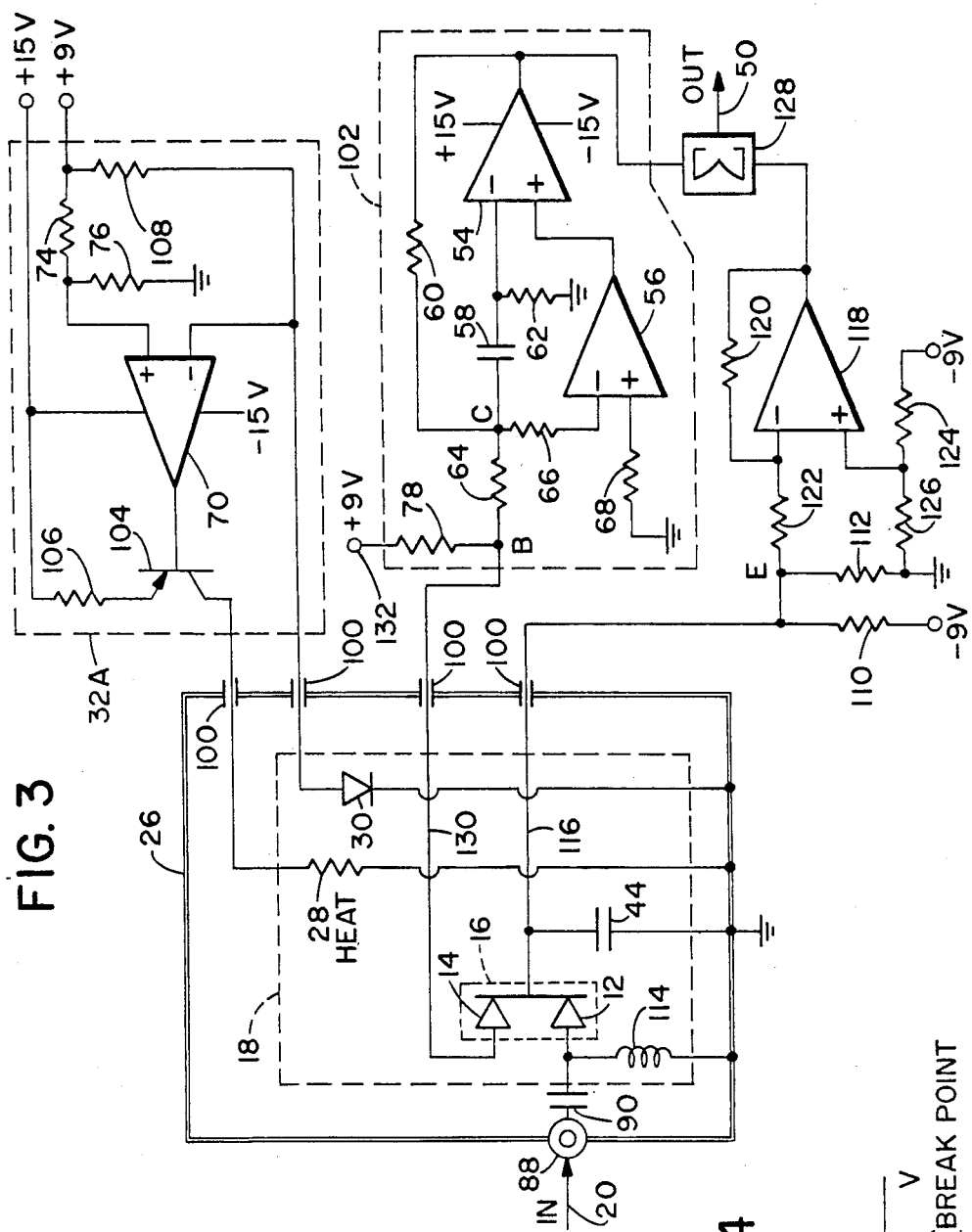
FIG. 3 is a schematic drawing of a second embodiment of the invention in which both of a pair of matched diodes are employed in signal detection while a third diode is used for temperature sensing.
FIG. 4 shows a characteristic curve of current versus voltage for a diode of the matched pair of diodes.

The configurations of the embodiments of FIGS. 2 and 3 share a number of components in common, the embodiment of FIG. 3 including a further feature and components not found in FIG. 2. Thus, the detector 16 of the matched pair of diodes 12 and 14 disposed on the substrate 18 and heated by the heater 28 are found also in FIG. 3. Unlike FIG. 2, a separate diode is employed as the temperature sensor in FIG. 3. The controller 32 of FIG. 2 is replaced with a controller 32A in FIG. 3. The circuit configuration of the amplifiers 54 and 56 with their interconnecting resistors and capacitor, identified by legend 102 in FIG. 2, is also employed in FIG. 3 wherein it is to be understood that the values of the resistors and the capacitor of the circuit 102 may be altered in FIG. 3 from the corresponding component value employed in FIG. 2, to adjust gain and bandwidth if so desired.

In FIG. 3, the controller 32A comprises the amplifier 70 and the resistors 74 and 76 connected to the positive input terminal thereof as has been disclosed for the controller 32 (FIG. 2). The controller 32A (FIG. 3)

further comprises a transistor 104 having a base terminal thereof connected to the output terminal of the amplifier 70, and an emitter terminal thereof connected via a resistor 106 to a source of voltage which, by way of example, provides a voltage of +15 volts. A resistor 108 connects between a source of voltage providing +9 volts, by way of example, to the negative input terminal of the amplifier 70 and to the diode of the temperature sensor 30, which diode is disposed on the substrate 18 for sensing the temperature thereof. A terminal of the resistor 74 is also connected to the voltage source of +9 volts. Power for operating circuitry of the amplifier 70 may be provided, by way of example, of a voltage source outputting both +15 volts and −15 volts, it being understood that the other amplifiers of FIG. 3 may be provided similarly. The collector terminal of the transistor 104 connects via a feed-through terminal 100 of the oven 26 to the heater 28 for applying current to the resistor thereof in response to a signal outputted by the amplifier 70. The diode of the temperature sensor 30 increases its electrical conductivity in response to an increase in temperature of the substrate 18, and decreases its electrical conductivity in response to a decrease in temperature of the substrate 18, thereby to draw current through the resistor 108 to provide a voltage drop across the resistor 108 which activates the amplifier 70 to decrease or increase, respectively, current applied to the heater 28 to maintain temperature of the substrate 18.

Upon comparing FIGS. 1 and 3, it is noted that the function of the bias circuit 34 of FIG. 1 is provided by a voltage divider comprising resistors 110 and 112 (FIG. 3) with current being fed via a serial connection of resistor 110 and the diode 12 plus an inductor 114. The inductor 114 is connected between the anode terminal of the diode 12 and ground. The resistor 110 connects with a −9V terminal of a voltage source, the opposite terminal of the voltage source being grounded to complete the bias current circuit. The function of the bias circuit 36 is provided by the resistor 78 which is connected between a +9V terminal of the voltage source to the anode terminal of the diode 14. The cathode terminal of the diode 14 is connected to the cathode terminal of the diode 12 to form a common diode terminal of the assembly 16, which common diode terminal is connected via line 116 to node E at the junction of resistors 110 and 112. Thus, bias current for the diode 14 is provided by the resistors 78 and 64, and bias current for the diode 12 is provided by the combination of the three resistors 78, 110, and 112. In addition, it is noted that the resistor 64 of the amplifier circuit 102 connects between nodes B and C the latter being held at a substantially constant reference voltage by feedback action of the resistor 60. Because of the substantially constant value of voltage at node C, node C may be referred to as a virtual reference. In the embodiment of FIG. 3, node C has a value of zero volts while, in the embodiment of FIG. 2, node C has a value of 0.13 volts, these values being given by way of example. Therefore, it is understood that resistor 64 also plays a role in establishing the bias current impressed upon the diode 14. Due to the virtual reference of node C, resistors 78 and 64 may be characterized as a voltage divider wherein node B is connected directly via the diode 14 to node E of the voltage divider of the resistors 110 and 112. Since all four of the resistors 64, 78, 110, and 112 play a role in establishing the bias current in the diode 12, while only the resistors 78 and 64 are employed for establishing the bias current in the diode 14, resistance values of these resistors can be selected to establish independently bias currents for the two diodes 14 and 12.

As has been noted above, the diode 12 is serially connected with the capacitor 44 to provide for detection of an r.f. signal inputted via line 20. The detected signal is outputted via line 116 to node E. The embodiment of FIG. 3 further comprises an amplifier 118 with a feedback resistor 120 connected between an output terminal of the amplifier 118 to an input terminal thereof, and a resistor 122 for inputting a signal from node E to the negative input terminal of the amplifier 118. A voltage divider comprising resistors 124 and 126 connects between terminals of the −9V supply to provide a reference voltage at a junction between the resistors 124 and 126, the reference voltage being applied to the positive input terminal of the amplifier 118.

Upon comparing the circuit of FIG. 1 with that of FIG. 3, it is noted that the functions of the amplifiers 42 and 46 with the summer 48 (FIG. 1) are accomplished in FIG. 3 by use of the amplifier 118 and the amplifier circuit 102 with a summer 128 connected between output terminals of the amplifier 118 and the amplifier circuit 102. In accordance with a feature of the invention, amplification of the detected signal on line 116 is accomplished by use of both the amplifier circuit 102 and the amplifier 118 while the differential exclusion of the common mode of thermally induced bias drift voltages is accomplished by the differential connection of the diodes 12 and 14 in cooperation with the amplifier 118. The use of the amplifier circuit 102 for amplifying the detected signal on line 116 is accomplished with the aid of a signal appearing on line 130 produced by the diode 14 in response to the detected signal on line 116.

The signal on line 130 which is fed to the amplifier circuit 102 is produced as follows. The current flowing in line 130 depends on the voltage drop between circuit point 132 (the +9V terminal) and the voltage at line 116. Upon a detection of an input signal, the voltage at line 116 rises resulting in a decrease of current through the resistor 78 into the diode 14. Due to the nonlinear characteristics of the diode 14 in the region of the breakpoint of its characteristic current-versus-voltage curve (FIG. 4), there is little voltage-change across the diode 14 during the foregoing shift in current amplitude in line 130. Therefore, diode 14 may be regarded as acting as a level shifter wherein the level of voltage at line 130 rises and falls with the level of voltage at line 116.

The foregoing level shifting occurs only for relatively small values of input signal. For larger values of signal voltage, the resistor 64 tends to draw increasing amounts of current from node B to the virtual voltage reference at node C. This introduces a clamping action to the voltage shifting resulting in negligible amounts of detected signal increments appearing on line 130 at larger signal values. However, the full value of detected signal voltage is always present on line 116 for all values of input signal magnitude. The amplifier circuit 102 is employed to amplify only the signal on line 130, this signal being coupled to the negative input terminals of the amplifiers 56 and 54. The positive input terminal of amplifier 56 is grounded via resistor 68, rather than being used to receive an input signal as was disclosed in the embodiment of FIG. 2. The amplifier circuit 102 provides a relatively high gain and is resistant to drift. However, the dynamic range of the amplifier circuit 102, with respect to input signal amplitude is relatively low. The low dynamic range is compensated by use of the feedback amplifier 118 which receives the detected signal on line 116 via resistor 122. The amplifier 118 with the feedback resistor 120 provides for a lower voltage gain and higher dynamic range than does the amplifier circuit 102. The output signal of the amplifier circuit 102 is limited in the value of its output signal applied to the summer 128 by virtue of the above-noted limitation on the level shifting of the diode 14. Therefore, the output signal on line 50, which output signal is the sum of the output signals of the amplifier configuration 102 and the amplifier 118, is primarily composed of the signal component provided by the amplifier 118 for large values of input signal, while the component of the signal provided by the amplifier circuit 102 dominates the output signal for small values of input signal at line 20. The effect of drift on the amplifier 118 is of relatively little significance because, for large values of signal, the component of drift is negligibly small compared to the signal amplitude. With respect to thermally induced bias voltage drift in the two diodes 12 and 14, which diodes are also formed as Schottky diodes in the embodiment of FIG. 3, it is noted that because of the monolithic structure and consequent matching any increase in the voltage drop across diode 12 raises the voltage at line 116 with an identical increase in the voltage drop across diode 14. In view of the differential circuit in the connection of the two diodes 12 and 14, a positive increment in bias voltage at one diode is essentially balanced out by the equal positive increment in the bias voltage of the other diode, this providing for a cancellation of the common mode of bias current on line 116, resulting in the voltage at the anode of diode 14 remaining equal to the anode voltage at diode 12, essentially, zero volts D.C.

With respect to the filtering of r.f. signals, the inductor 114 prevents the circulation of r.f. signals through the bias circuit of the diode 12. The inductor 114 provides a relatively high impedance to the r.f. signal, so as to direct the r.f. signal to the diode 12, while providing a low resistance path to DC bias current. With respect to the bias current supplied by line 130 to the diode 14, no r.f. filter is shown in FIG. 3, other than filtering provided by the feed-through terminal 100; however, if desired, a filter such as that composed of inductor 86 and capacitor 92 (FIG. 2) may be employed on line 130 (FIG. 3) in the same fashion as is employed on line 94 (FIG. 2). With respect to parameter values employed in the construction of the circuitry of FIG. 3. the amplifier circuit 102 has a gain of approximately 30 while the amplifier 118 with its feedback provides for a gain of two. Thus, it may be appreciated that the amplifier 118 serves primarily as a buffer to isolate the detection process from subsequent signals processing at the processor 52 (FIG. 1). The voltage settings at nodes B and C of FIG. 3 are approximately equal to each other, the voltage setting being approximately zero volts DC. The corresponding voltage settings in the circuitry of FIG. 2 are approximately equal to 0.13V DC. By way of further example in the selection of parameter values, in FIG. 2 the feedback resistor 60 is equal in resistance to the bias resistor 84, and the input resistor 64 is equal to the bias resistor 82. The ratio of the feedback resistor 60 to the input resistor 64 is approximately thirty. In FIG. 3, the resistors 60, 64, and 78 have resistance values of 1500 ohms, 200 ohms, and 16,000 ohms, respectively. The relatively large value of the resistor 78 makes the current flow therein relatively insensitive to changes of resistance in the diode 14, thereby enabling the resistor 78 to serve as a current source. The relatively small value of resistance in the resistor 64 provides for the clamping of the level shifting to all but relatively small values of signal voltage on line 130. Nominal values of voltage inputted to both input terminals of the summer 128, in the absence of an input signal on line 20, are at approximately zero volts DC. Input voltages to the amplifier 70 have values of approximately 0.13 V. Input voltages to the amplifier 118 have values of approximately −0.13 V. The value of resistance in the biasing resistors 110, 112, 78, and 64 are set to provide for equal values of bias current in each of the diodes 12 and 14.

By virtue of the foregoing construction, there is provided a detector circuit employing Schottky diodes activated with bias currents, and wherein bias drift is minimized and compensated. Due to the monolithic construction of the diodes in a common assembly disposed on a thermally-controlled heated substrate, the temperature change of the detector assembly is maintained to better than 1 degree Centigrade with outside temperature variations in the range of −54 degrees to +85 degrees Centigrade. Also, the diodes themselves experience a difference in bias voltage in the range of only tens of microvolts. Such a small difference allows for accurate detection of microvolt signal levels.

It is to be understood that the above described embodiments of the invention are illustrative only, and that modifications thereof may occur to those skilled in the art. Accordingly, this invention is not to be regarded as limited to the embodiments disclosed herein, but is to be limited only as defined by the appended claims.

What is claimed is:

1. A detector circuit comprising:
   a first diode, a second diode having characteristics matched to said first diode, each of said diodes having a first terminal and a second terminal, the second terminal of each of said diodes being connected together as a common terminal;
   energy storage means, said second diode being operatively coupled to said energy storage means for detecting an input signal;
   amplifying means having an output terminal, a first input channel and a second input channel, said first input channel being connected to said first terminal of said first diode, said second input channel being connected to a terminal of said second diode; and wherein
   said first and said second input channels include respectively a first bias means and a second bias means for setting bias currents respectively in said first diode and said second diode; and
   said amplifying means amplifies said input signal while rejecting a common mode of bias voltages in said first and said second diodes to free a signal outputted at said output terminal of effects of thermal drift in either of said diodes.

2. A circuit according to claim 1 wherein said input signal is applied to a terminal of said second diode, and wherein said second channel is connected to the first terminal of said second diode.

3. A circuit according to claim 2 wherein the first terminal in each of said diodes is an anode, and the second terminal in each of said diodes is a cathode.

4. A circuit according to claim 3 wherein said first and said second bias means connect respectively to the anodes of said first and said second diodes, said second channel of said amplifying means receives the sum of a detected input signal and a bias voltage from the anode of said second diode, and said first channel of said amplifying means receives a bias voltage from the anode of said first diode.

5. A circuit according to claim 4 further comprising a first filter and a second filter for coupling respectively the first channel and the second channel to said first diode and said second diode, said filters excluding a radio-frequency component of said input signal from entering said amplifying means.

6. A circuit according to claim 5 wherein said first diode and said second diode are fabricated in monolithic form upon a common substrate, said circuit including a heater for said substrate, and means responsive to a bias voltage induced by the flow of bias current through said first diode for energizing said heater, said first diode serving as a sensor of temperature in said substrate, said first diode and said second diode each being Schottky diodes.

7. A circuit according to claim 1 wherein said first terminal of said second diode receives said input signal, and said second input channel is connected to said common terminal to provide said second channel with a differential input between bias voltage of said first and said second diodes.

8. A circuit according to claim 7 wherein said energy storage means is connected to said common terminal of said first and said second diodes, a detection of the input signal coupled via said second diode to said energy storage means introducing a corresponding signal current flowing through said first diode and said first bias means, and wherein said signal current of said first diode is amplified by said first channel of said amplifying means, said first bias means limiting a value of the signal current of said first diode to a relatively small signal amplitude, said first channel providing greater amplification to the input signal than said second channel of said amplifying means.

9. A circuit according to claim 8 wherein said first terminal in each of said diodes is an anode, and said second terminal in each of said diodes is a cathode diode, said first bias means connects between the anode and the cathode of said first diode, said second bias means connects between the anode and the cathode of said second diode; and wherein said detector circuit further comprises:

heating means and temperature sensing means, said first and said second diodes being formed as a monolithic structure on a common substrate heated by said heating means, said sensing means sensing the temperature of said substrate; and power means responsive to said temperature sensing means for energizing said heating means to maintain a stable temperature of said substrate.

10. A circuit according to claim 9 wherein said heating means is a resistor thermally connected to said substrate, and wherein said temperature sensing means is a third diode thermally connected to said substrate, said first diode and said second diode each being Schottky diodes.

11. A circuit according to claim 7 wherein said first terminal in each of said diodes is an anode, and said second terminal in each of said diodes is a cathode, said first bias means connects between the anode and the cathode of said first diode, said second bias means connects between the anode and the cathode of said second diode; and wherein said detector circuit further comprises:

heating means and temperature sensing means, said first and said second diodes being formed as a monolithic structure on a common substrate heated by said heating means, said sensing means sensing the temperature of said substrate; and power means responsive to said temperature sensing means for energizing said heating means to maintain a stable temperature of said substrate.

12. A circuit according to claim 11 wherein said heating means is a resistor thermally connected to said substrate, and wherein said temperature sensing means is a third diode thermally connected to said substrate; and wherein said first bias means comprises a first resistive voltage divider circuit disposed at an input end of said first channel, and said second bias means comprises a second resistive voltage divider circuit coupled to an input end of said second channel of said amplifying means.

13. A circuit according to claim 12 wherein said first and said second channels of said amplifying means comprise respectively a first and a second feedback amplifier, said amplifying means including means for summing together output signals of said first and said second feedback amplifiers, said energy storage means being a capacitor coupled to said common terminal of said first and said second diodes for outputting a detected voltage to an input terminal of said second feedback amplifier.

14. A detector circuit comprising:
a first diode and a second diode formed as a monolithic structure upon a common substrate;
a capacitor connected in parallel to said second diode, said second diode detecting an input signal applied to a terminal thereof;
means for heating said substrate;
means connected to said first diode for energizing said heating means, said first diode serving as a sensor of temperature of said substrate to activate said energizing means to energize said heating means for maintaining said substrate at a predetermined temperature;
means for biasing said first diode and said second diode to maintain equal values of bias voltage in said first and said second diodes; and
differential amplifier means connected to each of said diodes for amplifying signals appearing across each of said diodes, a signal appearing across said first diode comprising a voltage produced by said bias current in said first diode, a signal appearing across said second diode comprising a bias voltage produced by a bias current flowing in said second diode plus the voltage of a detected input signal, said differential amplifier means amplifying said detected signal voltage while rejecting bias voltages produced by said bias currents as a common mode signal by virtue of differential operation of said amplifying means.

15. A circuit according to claim 14 wherein said first and said second diodes are each Schottky diodes.

16. A detector circuit comprising:
a first diode and a second diode formed monolithically on a common substrate, each of said diodes having a first terminal and a second terminal, the second terminal of each of said diodes being connected together as a common terminal;
a capacitor, said second diode being connected together via said common terminal to said capacitor for detection of an input signal applied to the first terminal of said second diode;

means for heating said substrate;

means including a third diode for energizing said heating means, said third diode being thermally coupled to said substrate for sensing the temperature thereof to activate said energizing means to energize said heating means for maintaining said substrate for stabilizing a temperature thereof;

amplifying means having a first channel connected to the first terminal of said first diode and a second channel connected to the common terminal of said first and said second diodes;

biasing means connected between the first terminal of said first diode and said common terminal and further connected between said first terminal of said second diode and said common terminal for impressing equal bias currents in said first and said second diodes; and wherein said second channel of said amplifying means includes a differential amplifier having one input terminal receiving the bias voltage resulting from the sum of the two bias currents from the common terminal, and a second input terminal connected to a reference voltage to subtract the sum of the bias currents from an output signal of said amplifying means; and the detection of the input signal at said second diode induces a detected signal voltage at said first diode, said first channel of said amplifying means including a feedback amplifier of higher gain than said differential amplifier of said second channel for amplifying detected signals induced in said first diode, said bias means cooperating with said feedback amplifier to limit signals of said first diode to a relatively small value, said differential amplifier of said second channel amplifying signals of both small and large values; and wherein said amplifying means includes means for summing together an output signal of said feedback amplifier of said first channel and an output signal of said differential amplifier of said second channel, said feedback amplifier of said first channel being constructed of low-drift circuitry to ensure that a signal outputted by said summing means of said amplifying means is essentially free of thermally induced drift at said first and said second diodes.

17. A circuit according to claim 16 wherein said first and said second diodes are each Schottky diodes.

* * * * *